(12) United States Patent
Zang et al.

(10) Patent No.: US 10,115,738 B2
(45) Date of Patent: Oct. 30, 2018

(54) SELF-ALIGNED BACK-PLANE AND WELL CONTACTS FOR FULLY DEPLETED SILICON ON INSULATOR DEVICE

(71) Applicant: GLOBALFOUNDRIES INC., Grand Cayman (KY)

(72) Inventors: Hui Zang, Guilderland, NY (US); Min-Hwa Chi, San Jose, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/354,205

(22) Filed: Nov. 17, 2016

(65) Prior Publication Data
US 2018/0138203 A1 May 17, 2018

(51) Int. Cl.
| H01L 29/10 | (2006.01) |
| H01L 27/12 | (2006.01) |
| H01L 29/786 | (2006.01) |
| H01L 21/8238 | (2006.01) |
| H01L 29/49 | (2006.01) |

(52) U.S. Cl.
CPC .. *H01L 27/1203* (2013.01); *H01L 21/823878* (2013.01); *H01L 29/1087* (2013.01); *H01L 29/4983* (2013.01); *H01L 29/78648* (2013.01)

(58) Field of Classification Search
CPC ............. H01L 29/78648; H01L 29/423; H01L 29/1087
See application file for complete search history.

(56) References Cited

U.S. PATENT DOCUMENTS

| 7,772,649 B2* | 8/2010 | Cheng ..................... H01L 21/84 257/316 |
| 2004/0046207 A1* | 3/2004 | Dennard ........... H01L 29/66772 257/347 |
| 2011/0227159 A1* | 9/2011 | Chan ................... H01L 21/7624 257/351 |
| 2014/0319648 A1* | 10/2014 | Fenouillet-Beranger .................... H01L 27/0259 257/526 |
| 2016/0013205 A1* | 1/2016 | Vinet .................... H01L 21/762 257/351 |

OTHER PUBLICATIONS

Leti et.al., "UTBB FDSOI transistors with dual STI for a multi-Vt strategy at 20nm node and below", IEEE, Dec. 2012, 5 pages.

* cited by examiner

*Primary Examiner* — Daniel Luke
(74) *Attorney, Agent, or Firm* — Anthony Canale; Andrew M. Calderon; Roberts Mlotkowski Safran Cole & Calderon, P.C.

(57) ABSTRACT

The present disclosure generally relates to semiconductor structures and, more particularly, to self-aligned back-plane and well contacts for a fully depleted silicon on insulator device and methods of manufacture. The structure includes a back-plane, a p-well and an n-well formed within a bulk substrate; a contact extending from each of the back-plane, the p-well and the n-well; a gate structure formed above the back-plane, the p-well and the n-well; and an insulating spacer isolating the contact of the back-plane from the gate structure.

20 Claims, 9 Drawing Sheets

SELF-ALIGNED BACK-PLANE AND WELL CONTACTS FOR FULLY DEPLETED SILICON ON INSULATOR DEVICE

FIELD OF THE INVENTION

The present disclosure generally relates to semiconductor structures and, more particularly, to self-aligned back-plane and well contacts for a fully depleted silicon on insulator device and methods of manufacture.

BACKGROUND

Silicon on insulator (SOI) ultra-thin body (UTB) devices are an attractive technology for relatively superior performance and low parasitic capacitance. UTB can also offer a multi-threshold voltage (Vt) scheme by biasing the back-plane (BP) underneath transistors. Passive device integration (e.g., resistors and capacitors) with complementary metal oxide semiconductor (CMOS) devices need integration in a bulk substrate. Therefore, both the BP and the wells need contacts landing on the bulk substrate.

Contacts for the BP and wells can have issues and challenges. For example, each contact landed on the Si bulk substrate region requires a minimum footprint of one Rx island, with a shallow or deep trench isolation structure surrounding each contact. Another challenge is that the topography for the contact landing to the bulk substrate may lead to defects and yield issues.

Additional issues in forming the contacts include after etching the SOI region to reveal a bulk substrate, there is a topography which can lead to process difficulty for downstream process steps, e.g., contact lithography/etching. One approach suggests to grow epitaxial silicon on the bulk area to the same level as the SOI, but the process complexity can lead to high cost and also epi-Si defects/bumps at the interface, causing process variability, among other issues. For example, issues concerning the formation of the BP contact structure include: (i) each back side contact landing on Si bulk region with minimum footprint of one Rx island and STI surrounding; and (ii) topography for the contact landing.

SUMMARY

In an aspect of the disclosure a structure comprises: a back-plane, a p-well and an n-well formed within a bulk substrate; a contact extending from each of the back-plane, the p-well and the n-well; a gate structure formed above the back-plane, the p-well and the n-well; and an insulating spacer isolating the contact of the back-plane from the gate structure.

In an aspect of the disclosure a structure comprises: a first well formed within a bulk substrate; a first contact extending from the first well; a gate structure formed over the first well; and a first spacer isolating the first contact from the gate structure.

In an aspect of the disclosure a method comprises: forming a back-plane, a p-well and an n-well in a bulk substrate; forming contacts extending from each of the back-plane, the p-well and the n-well; forming a gate structure above the back-plane, the p-well and the n-well; and forming an insulating spacer isolating the contact of the back-plane from the gate structure.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
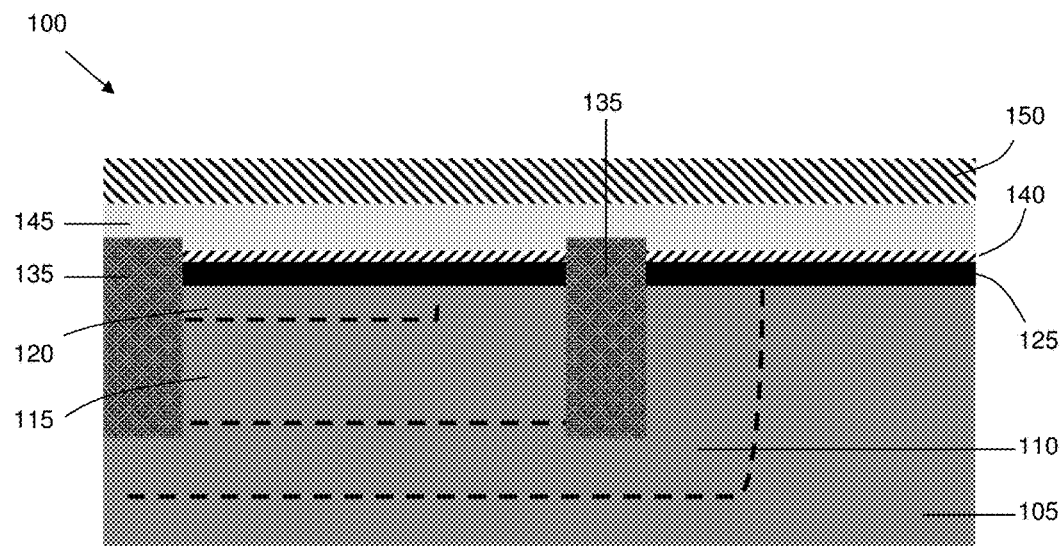
FIG. 1 shows a fully depleted silicon on insulator (FD-SOI) device with deep trench isolation (DTI) structures and respective fabrication processes in accordance with aspects of the present disclosure.

The disclosure generally relates to semiconductor structures and, more particularly, to self-aligned back-plane and well contacts for a fully depleted silicon on insulator (FD-SOI) device and methods of manufacture. In embodiments, a spacer is used as isolation when forming bulk contacts in a self-align manner. The methods and structures described herein include the advantages of eliminating the above noted issues of conventional structures and methods of manufacturing, allowing for a smaller footprint for a relatively low cost.

In embodiments, the isolation between a contact of a p-well and source and drain regions of a gate structure is provided by a low-k spacer; instead of a shallow trench isolation (STI) structure as in conventional structures. In embodiments, the gate structures can be formed prior to the formation of the contacts. In alternative embodiments, the contacts are formed prior to the formation of the gate structures.

In embodiments, a back-plane (BP), a p-well and a deep n-well are formed within a bulk substrate, followed by the formation of deep trench isolation (DTI) structures. The formation of the DTI structures is followed by a deposition of a thin oxide layer, a silicon layer, and a hardmask layer. A patterning of these layers occurs, followed by etching and stripping processes. The etching and stripping processes are followed by a deposition of a spacer material, followed by an etch back and then an etching down of the remaining BOX layer down to the bulk substrate. In further embodiments, an oxidized material sidewall provides further isolation in addition to the later formed spacers.

In embodiments in which the gate is formed prior to the formation of the well contact, a masking material is deposited between the spacers, followed by the deposition of an oxide over the masking material. A further stripping process is implemented to remove the silicon and hardmask layers, followed by the gate structure formation. After the formation of the gate structure using conventional CMOS processes, a dielectric is deposited followed by a lithography process to access the source and drain regions of the gate and the BP, p-well and deep n-well. The method continues with the formation of a contact, which involves the deposition of a liner, followed by the deposition of tungsten (W) and then a polishing process to form the S/D, BP and well contacts.

In embodiments in which the contacts of the BP, p-well and deep n-well are formed prior to the formation of the gate structures, the contacts are formed by the deposition of metallization layers followed by a polishing process, with the polish stopping on a hardmask layer. After the formation of the contacts, the silicon and hardmask layers are removed, followed by the formation of the gate structures with the source and drain regions. A dielectric is deposited followed by a lithography process to access the source and drain regions of the gate structures and the BP, p-well and deep n-well contacts. The method continues with the formation of a contact/plug, which involves the deposition of a liner, followed by the deposition of tungsten (W) and then a polish.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

FIG. 1 shows a structure and respective fabrication processes in accordance with aspects of the present disclosure. More specifically, FIG. 1 shows a structure 100 comprising a bulk substrate 105 that includes an N back-plane (NBP) 120, p-well 115 and deep n-well 110. As illustrated in FIG. 1, deep trench isolation (DTI) structures 135 are formed within the bulk substrate 105. The DTI structures 135 can be made of any suitable insulator material, e.g., $SiO_2$ material, among other examples. The DTI structures 135 can extend through a BOX 125 and to the deep n-well 110. The DTI structures 135 can be made by conventional lithography, etching and deposition methods, followed by a chemical mechanical polishing (CMP).

Following the formation of the DTI structures 135, a deposition of a thin oxide layer 140 is performed on the surface of the DTI structures and other exposed surfaces. The thin oxide layer 140 can be deposited using a conventional deposition process, e.g., chemical vapor deposition (CVD), among other examples. Additionally, the thin oxide layer 140 can serve as a shallow trench isolation (STI) structure. An amorphous layer 145 is deposited on the oxide layer 140. The amorphous layer 145 can be an amorphous silicon layer for example, deposited by conventional deposition processes, e.g., atomic layer deposition (ALD) process, among other examples. The deposition of the amorphous layer 145 is followed by a polish, such as a chemical mechanical polish (CMP) process. After the polishing, a hardmask 150 is deposited over the amorphous layer 145. The hardmask 150 can be made of an inorganic material, such as SiN. The hardmask 150 can be deposited through a CVD process, among other examples.

Figure 2:
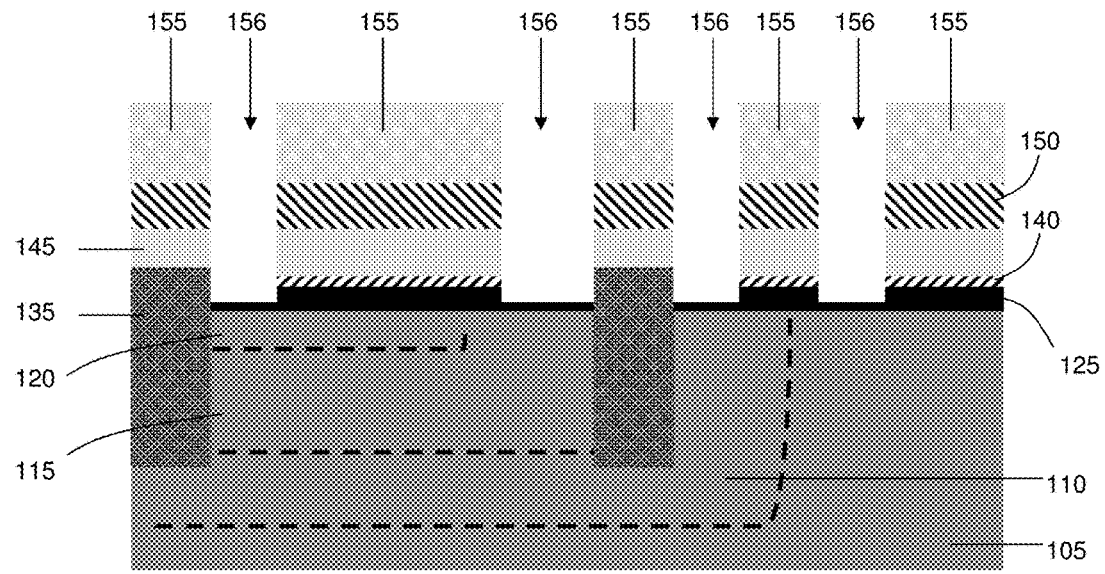
FIG. 2 shows the FDSOI device with an applied photoresist and respective fabrication processes in accordance with aspects of the present disclosure.

Referring to FIG. 2, a photoresist 155 is applied over the hardmask 150 so that a patterning process can be performed. Specifically, the photoresist 155 is formed over the hardmask and exposed to energy (light) to form a pattern (openings). An etching process, e.g., reactive ion etching (RIE) process, with selective chemistries is performed through the openings to form trenches 156 through the hardmask 150, the amorphous layer 145, the thin oxide 140 and the BOX 125. In embodiments, the etching process can either stop on the BOX 125 or partially extend into the BOX 125. Accordingly, in embodiments, the BOX 125 can be an etch stop layer. In embodiments, the trenches 156 will be used for the self-alignment of the later formed contacts for the NBP 120, the p-Well 115 and the deep n-well 110. After the formation of the trenches 156, the photoresist 155 is stripped by a stripping process, e.g., oxygen ashing or other stripants. In embodiments, a further step of oxidizing a material within the openings can be implemented to provide additional isolation for the later formed contacts with respect to the later formed gates.

Figure 3:
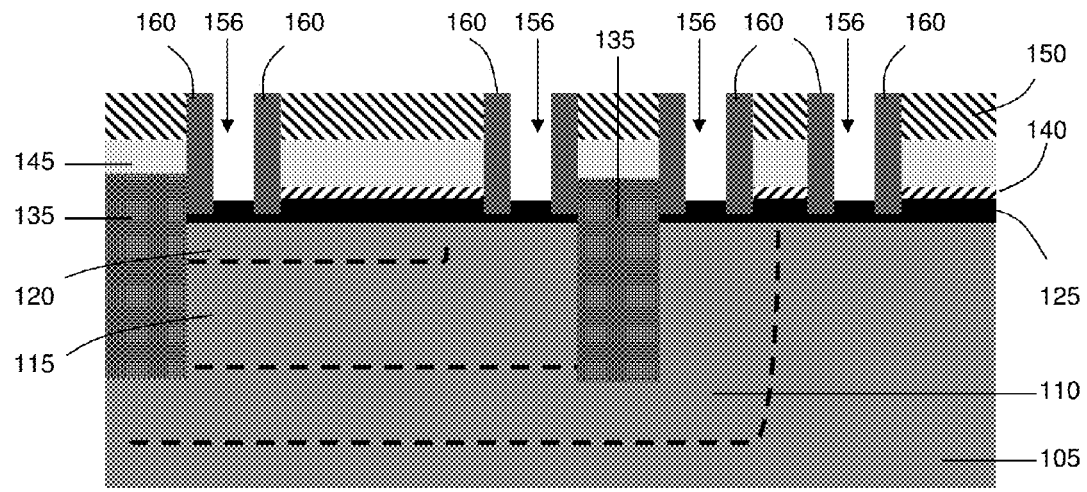
FIG. 3 shows the FDSOI device with spacers and respective fabrication processes in accordance with aspects of the present disclosure.

FIGS. 3-9 illustrate embodiments in which the gates are formed prior to the formation of the contacts. In FIG. 3, spacers 160 are deposited on sidewalls of the trenches 156. The spacers 160 can be deposited by a blanket deposition, e.g., chemical vapor deposition (CVD). The spacers 160 can be made of a high-k dielectric material, e.g., hafnium based material. Further, the spacers 160 are self-aligned with assistance from the trenches 156 in order to be in self-alignment with the later formed contacts. The spacers 160 also provide isolation for the later formed contacts from the later formed gates. The deposition of the spacers 160 is followed by an etch back process, e.g., isotropic etching process, to remove the spacer material from a bottom surface of the trench 156.

Figure 4:
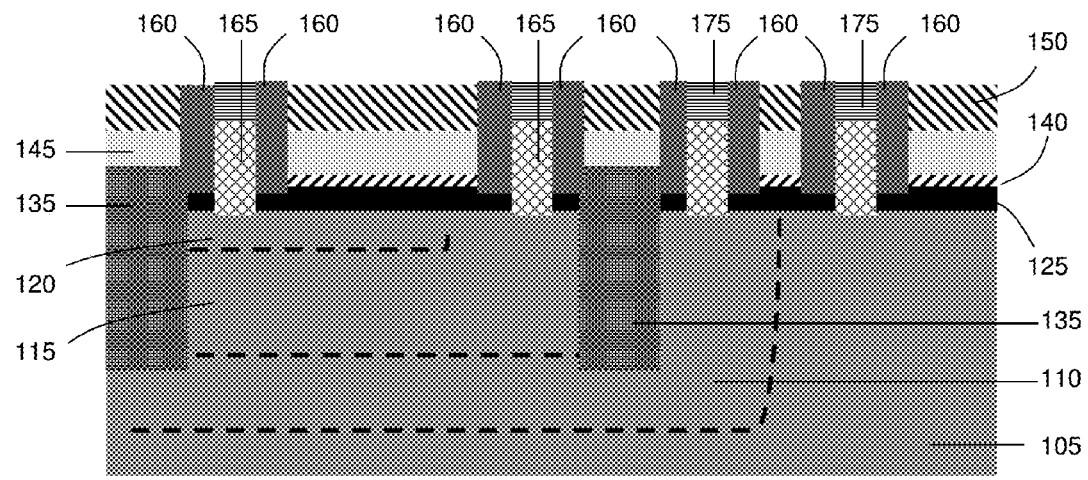
FIG. 4 shows the FDSOI device of FIG. 3 with masking materials formed between the spacers and respective fabrication processes in accordance with aspects of the present disclosure.

In FIG. 4, the BOX 125 can be removed at the bottom of the trenches 156 by an etch back process, e.g., RIE with chemistry selective to the BOX material. A hardmask material 165 is deposited in the trench 156, over the exposed portions of the bulk substrate 105. The hardmask material 165 can be an amorphous carbon or a deep ultraviolet light-absorbing oxide (DUO), among other examples. The hardmask material 165 can be deposited through a CVD process, among other examples. An oxide 175 is then deposited over the hardmask material 165 by conventional deposition processes, e.g., CVD, among other examples. A polish, e.g., CMP, is then performed to remove any oxide 175 and hardmask material 165 on the surface of the hardmask 150.

Figure 5:
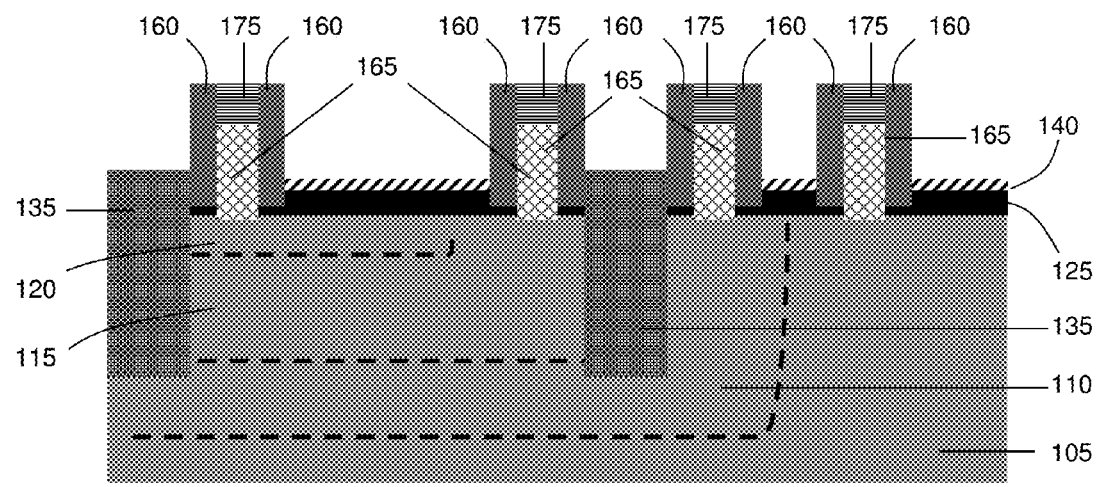
FIG. 5 shows the FDSOI device of FIG. 4 with masking and silicon layers removed and respective fabrication processes in accordance with aspects of the present disclosure.

In FIG. 5, the hardmask 150 and amorphous layer 145 are removed by a conventional etching process. The removal of the hardmask 150 and the amorphous layer 145 exposes portions of the spacers 160, the DTI structures 135 and the thin oxide layer 140.

Figure 6:
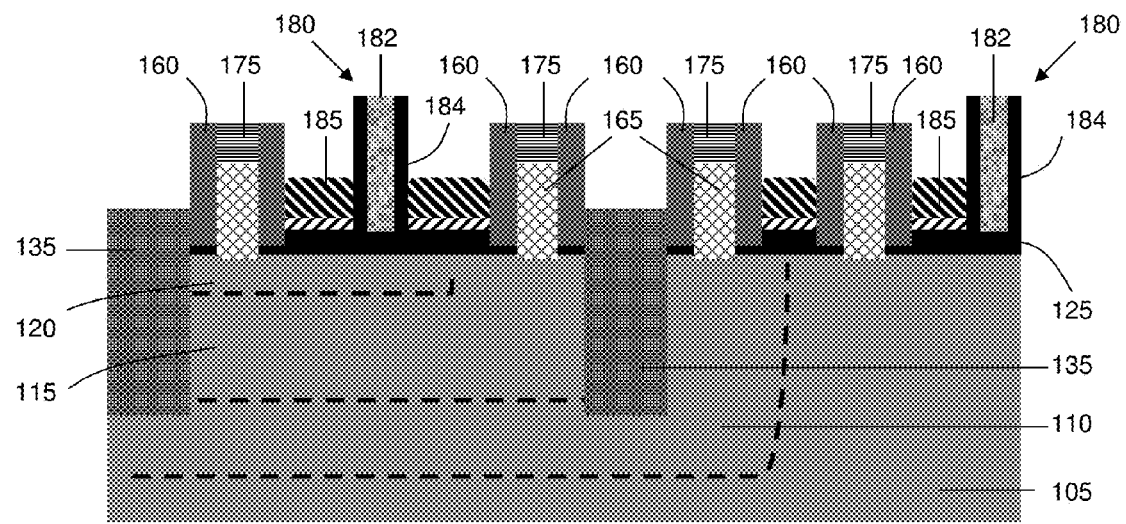
FIG. 6 shows the FDSOI device of FIG. 5 with gate structures formed and respective fabrication processes in accordance with aspects of the present disclosure.

In FIG. 6, gate structures 180 are formed, including the deposition of a gate dielectric, followed by polysilicon (PC) material 182 and gate spacers 184 surrounding the PC material 182, using conventional deposition and patterning processes. Epitaxial junctions are deposited over the remaining portions of the oxide layer 140 to form the source/drain (S/D) regions 185. It is noted that the FDSOI device fabrication can use the gate structure first formation flow.

Figure 7:
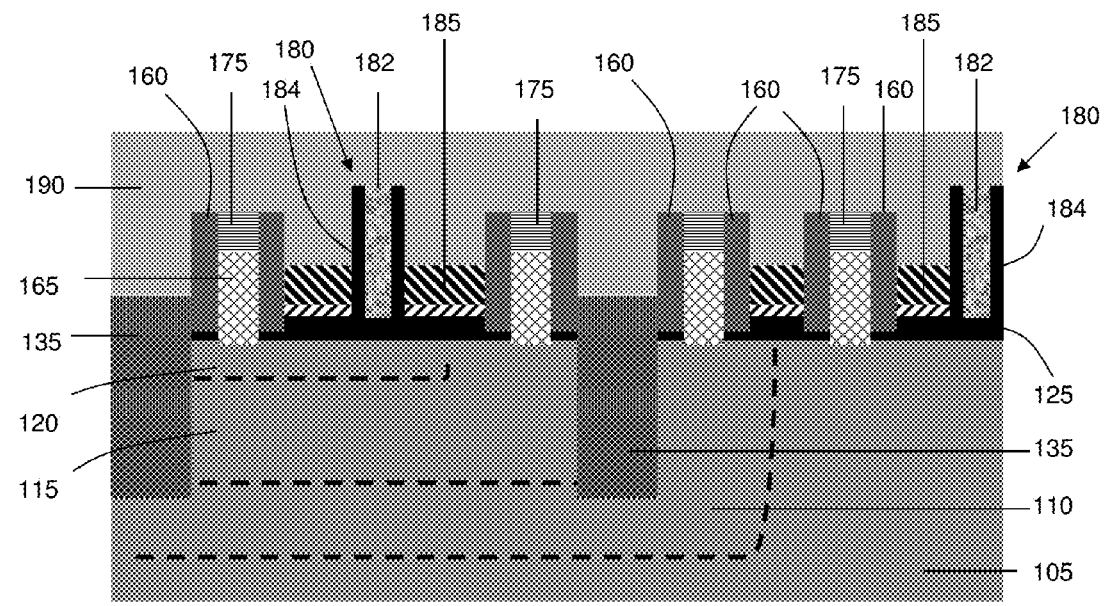
FIG. 7 shows the FDSOI device of FIG. 6 covered by an inter-layer dielectric and respective fabrication processes in accordance with aspects of the present disclosure.

In FIG. 7, an interlevel dielectric (ILD) 190 is deposited over the gate structures 180. The ILD 190 can be deposited by a CVD process. The ILD 190 can be an oxide material among other suitable insulator materials. The ILD 190 is planarized by CMP a process.

Figure 8:
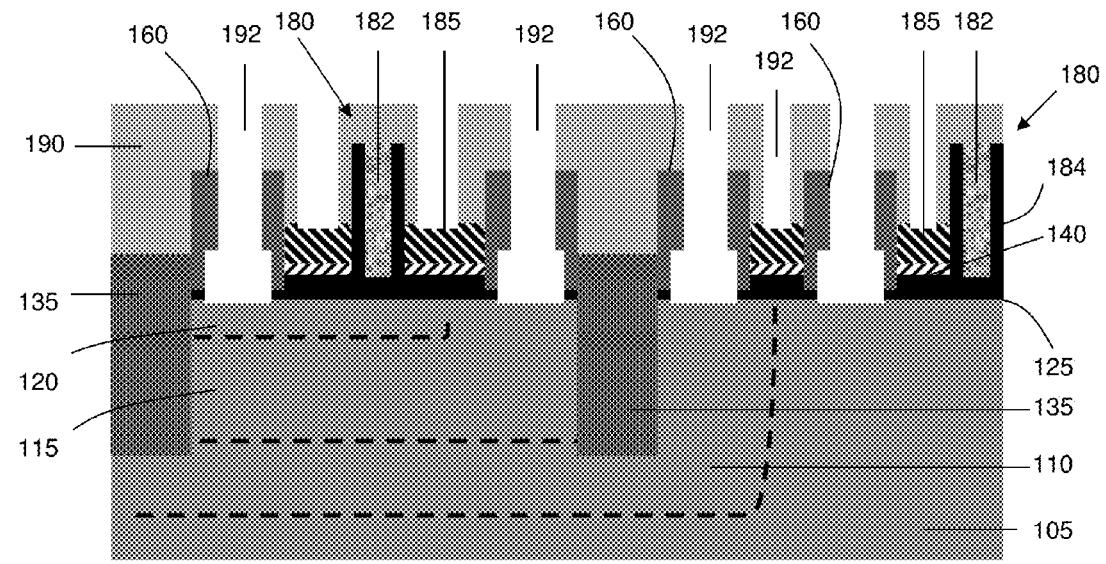
FIG. 8 shows the FDSOI device of FIG. 7 with the masking materials removed from the spacers and respective fabrication processes in accordance with aspects of the present disclosure.

In FIG. 8, trenches 192 are formed in the ILD 190 to open pathways to the S/D regions 185 of the gate structure 180 and the NBP 120, the p-well 115 and the deep n-well 110. The trenches 192 can be formed by a conventional lithography and etching process. In embodiments, the trenches 192 will expose the underlying substrate 150, such that selective chemistries are required for etching of the different materials to form the trenches 192. The masking material 165 is then stripped by a stripping process to expose portions of the NBP 120, the p-well 115 and the deep n-well 110.

Figure 9:
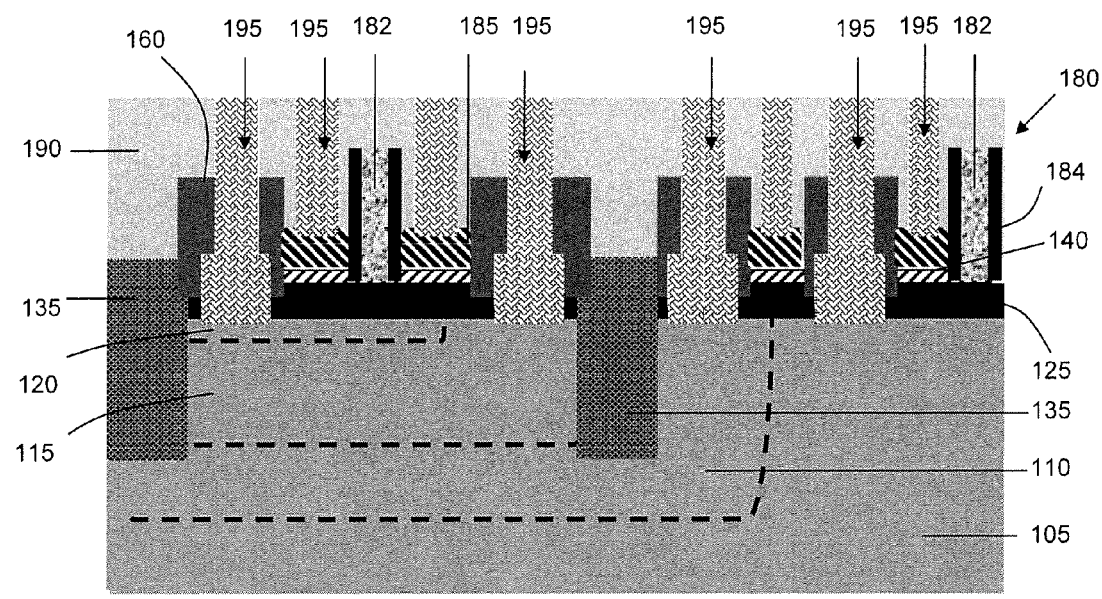
FIG. 9 shows the FDSOI device of FIG. 8 with contacts and respective fabrication processes in accordance with aspects of the present disclosure.
Figure 10:
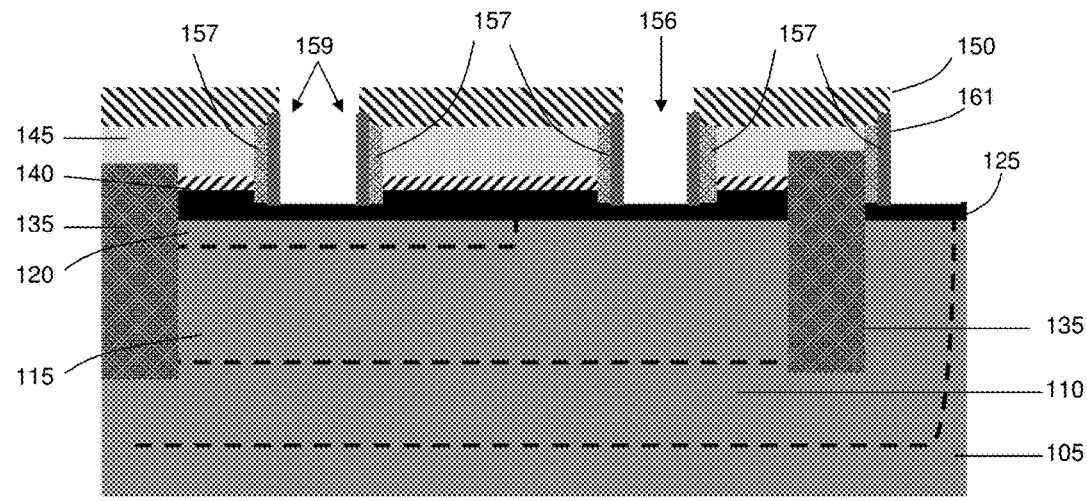
FIG. 10 shows an alternative FDSOI device formed with oxidized materials together with spacers and respective fabrication processes in accordance with aspects of the present disclosure.

FIG. 9 shows the formation of contacts 195 in the trenches 192. In embodiments, the contacts 195 may include a liner deposited on the sidewalls of the trenches 192. The liner can be made of various layers such as a titanium (Ti) layer and a titanium silicide nitride (TiSiN) layer formed upon the Ti layer. Alternatively, the liner can include Ti and TiN layers. Tungsten (W) or other conductive material is then deposited on the liner to form the contacts 195. Any residual material on the surface of the structure can then be removed by a CMP polishing process, stopping on the ILD 190. In embodiments, the contacts 195 extend through the ILD 190 to form contacts for the NBP 120, the p-well 115 and the deep n-well 110. By being formed in the trenches 192 of the ILD 190, the contacts 195 are self-aligned.

Also, as shown in FIG. 9, the isolation of the contacts 195 from the S/D regions 185 is provided by low-k spacers 160. The contacts 195 are thus formed in isolation with respect to the active S/D regions 185 by the low-k spacers 160; instead of a shallow trench isolation (STI) structure as in conventional structures. As illustrated in FIG. 9, the contacts 195 are in self alignment with the NBP 120, the p-well 115 and the deep n-well 110 with assistance from the spacers 160.

FIGS. 10-16 illustrate embodiments in which the contacts are formed prior to the formation of the gate structures. Additionally, FIGS. 10-16 illustrate the optional step of oxidizing material to form a oxidized material sidewall to provide further isolation between the contacts and the gate structures. More specifically, starting at FIG. 10, an insulating spacer 159 includes an oxidized material sidewall 157.

The oxidized material sidewall 157 is formed by an oxidation process, e.g., thermal oxidation, on sidewalls of the trenches 156. The insulating spacer 159 further includes a dielectric material 161 which is deposited in the trenches 156 on the oxidized material sidewalls 157 using a blanket deposition of a low-k dielectric material. In embodiments, the insulating spacers 159 isolate the later formed contacts from the gate structures. The deposition of the dielectric material 161 is followed by an etch back process, which removes the BOX 125 within the trenches 156, as previously described. The removal of the BOX 125 in the trenches 156 exposes portions of the bulk substrate 105.

Figure 11:
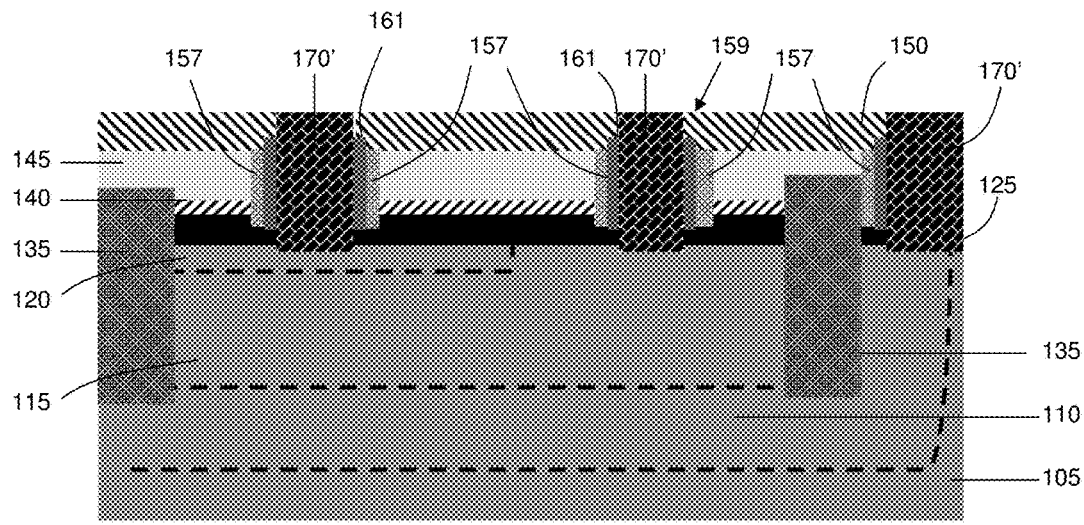
FIG. 11 shows the FDSOI device of FIG. 10 with contacts formed between the spacers and respective fabrication processes in accordance with aspects of the present disclosure.

In FIG. 11, contacts 170' for the NBP 120, the p-well 115 and the deep n-well 110 are formed prior to the gate structure formation. As previously disclosed, the contacts 170' can include the deposition of Ti and TiN layers, followed by a W or other conductive material deposition. After deposition of the conductive material, a polishing process, e.g., CMP, is performed, stopping on the hardmask 150. As shown in FIG. 11, the contacts 170' are self-aligned with assistance from the insulating spacers 159.

Figure 12:
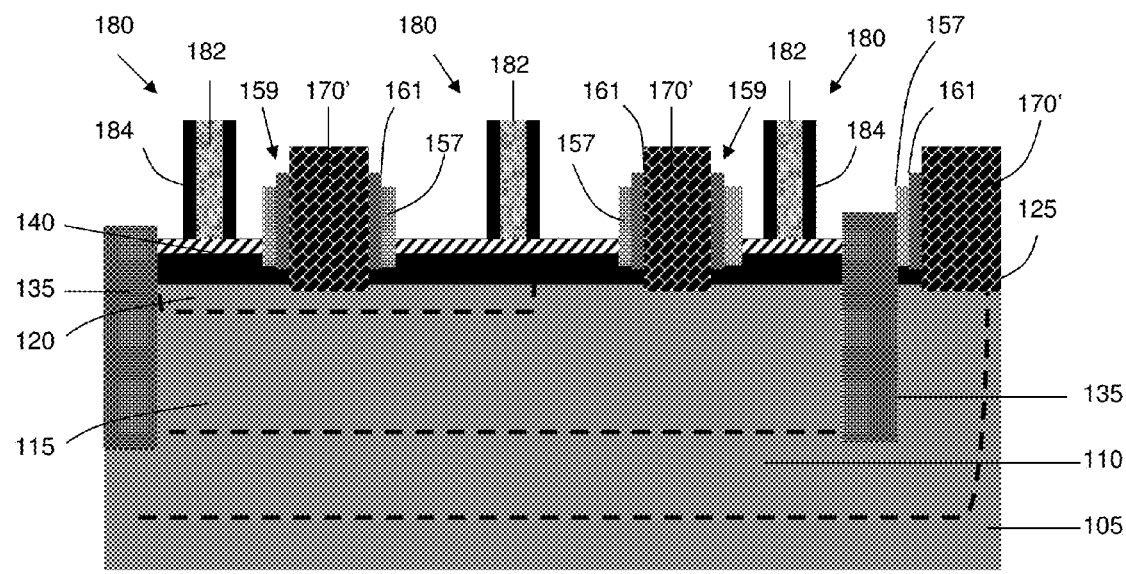
FIG. 12 shows the FDSOI device of FIG. 11 with gate structures formed and respective fabrication processes in accordance with aspects of the present disclosure.

In FIG. 12, the hardmask 150 and the amorphous layer 145 are removed. The removal of the hardmask 150 and the amorphous layer 145 exposes portions of the insulating spacers 159, including the oxidized material sidewall 157 and the dielectric material 161. Additionally, the removal of the hardmask 150 and the amorphous layer 145 exposes portions of the DTI structures 135 and thin oxide layer 140, and partially exposes the contacts 170'. The removal of the hardmask 150 and the amorphous layer 145 can occur by various stripping processes such as a RIE process with selective chemistries.

FIG. 12 further illustrates the formation of the gate structures 180. As noted previously, the gate structures 180 are formed by depositing a gate dielectric material, e.g., high-k dielectric material using conventional deposition process, followed by deposition of a PC material 182. After patterning of these materials using lithography and etching processes, gate spacers 184 are formed surrounding the PC material 182. The gate spacers 184 can be dielectric material.

Figure 13:
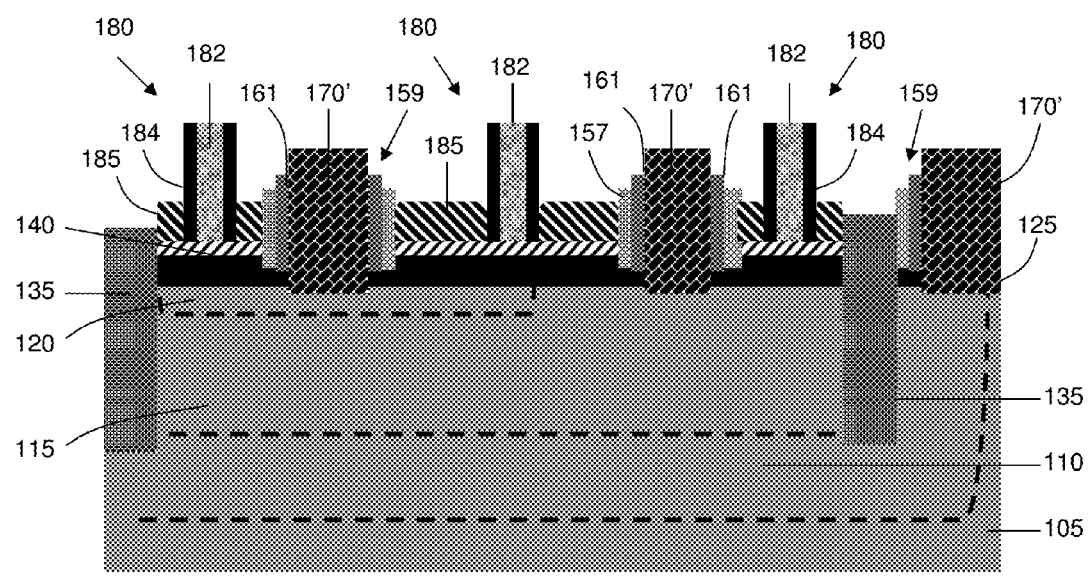
FIG. 13 shows the FDSOI device of FIG. 12 with source and drain regions formed and respective fabrication processes in accordance with aspects of the present disclosure.

FIG. 13 illustrates the deposition of epitaxial junctions over the remaining portions of the oxide layer 140. The epitaxial junctions form the source/drain (S/D) regions 185 of the gate structure 180, as should be understood by those of ordinary skill in the art.

Figure 14:
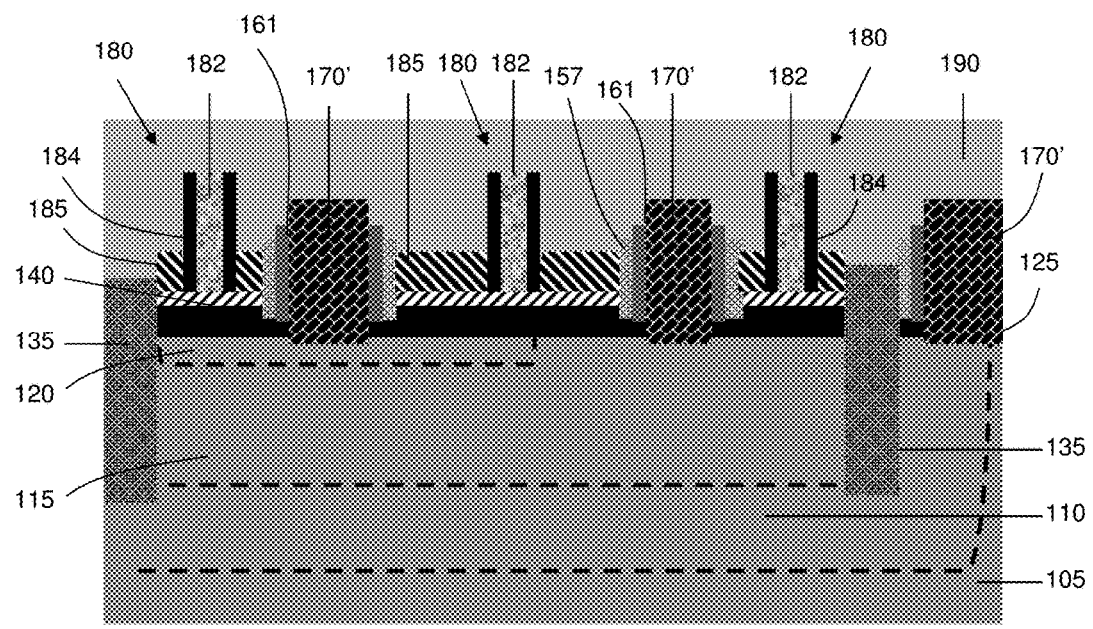
FIG. 14 shows the FDSOI device of FIG. 13 covered by an inter-layer dielectric and respective fabrication processes in accordance with aspects of the present disclosure.

In FIG. 14, an ILD 190 is deposited over the gate structures 180, which can be deposited by a CVD process and then planarized by a CMP process. The ILD 190 can be an oxide material among other suitable materials.

Figure 15:
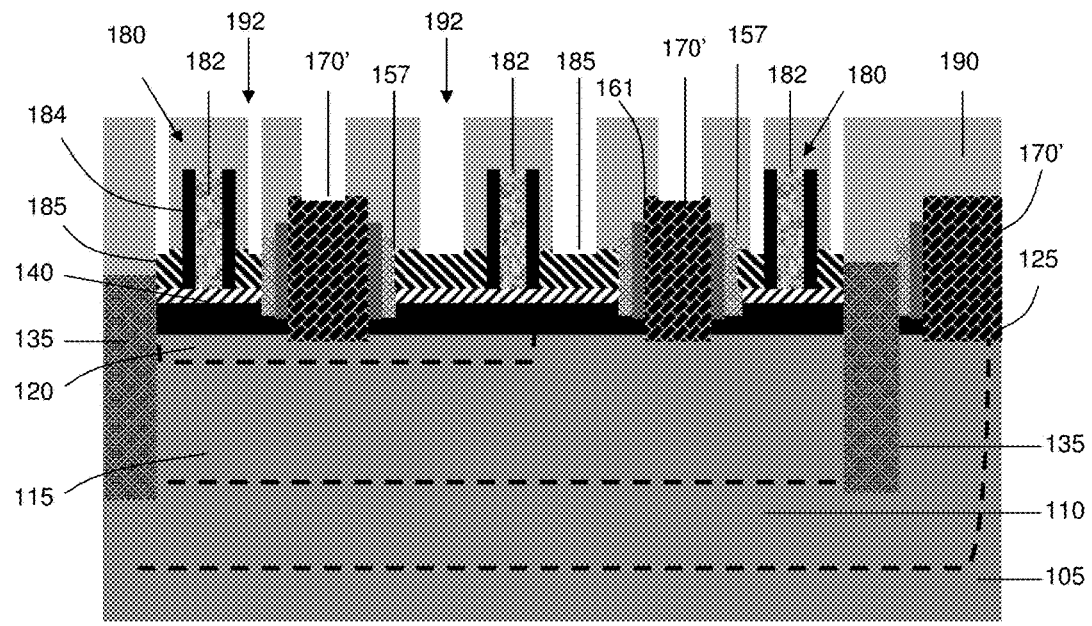
FIG. 15 shows the FDSOI device of FIG. 14 with openings extending to the source and drain regions and contacts and respective fabrication processes in accordance with aspects of the present disclosure.

In FIG. 15, the trenches 192 are formed in the ILD 190 to open pathways (vias) to the S/D regions 185 of the gate structures 180 and also pathways to the contacts 170' of the NBP 120 and the p-well 115. The trenches 192 are formed in the ILD 190 by lithography and etching processes. As shown in this embodiment, no pathway is formed through the ILD 190 to the contact 170' of the deep n-well 110. Therefore, the contact 170' of the deep n-well 110 is a floating contact. If desired, the remaining contacts 170' of the NBP 120 and the p-well 115 can also be formed as floating contacts, depending on the user's needs.

Figure 16:
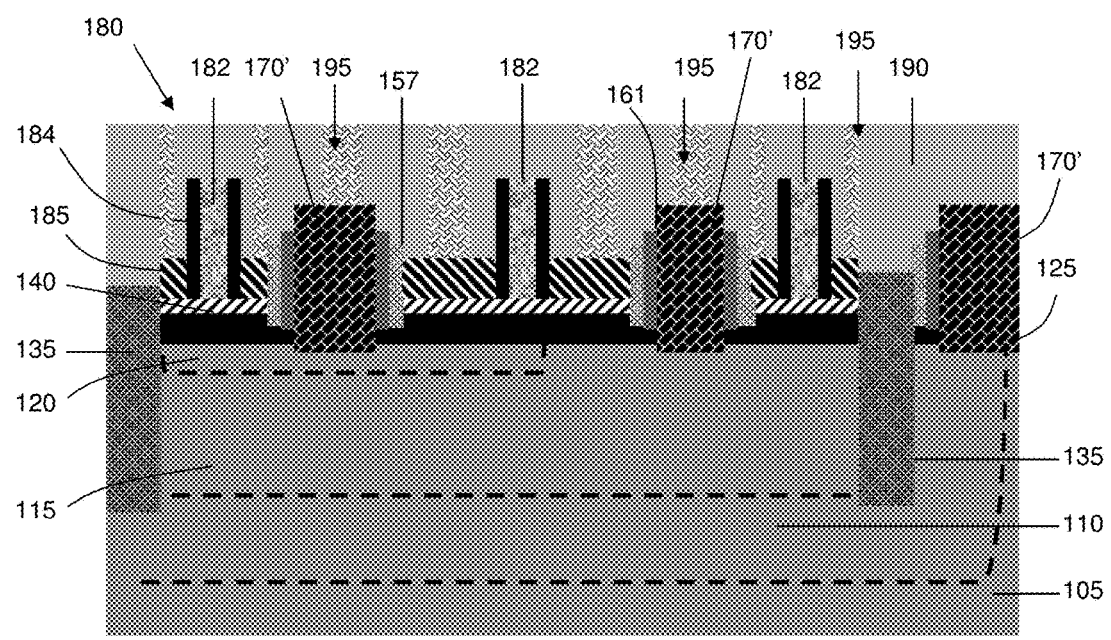
FIG. 16 shows the FDSOI device of FIG. 15 with additional contacts as plugs and respective fabrication processes in accordance with aspects of the present disclosure.

FIG. 16 illustrates the formation of the contacts 195, which includes the deposition of a liner onto the bulk substrate 105. The liner can be made of various layers such as a TiSiN layer formed upon a Ti layer, or Ti and TiN layers, among other examples. W or another conductive material is deposited upon the liner to form the contact 195, followed by a CMP polishing process, stopping on the ILD 190. As noted herein, the contact 195 extends through the ILD 190 to the S/D regions 185 of the gate structures 180. Further, the contacts 195 extend through the ILD 190 and cover the contacts 170' of the NBP 120, the p-well 115 and the deep n-well 110. Therefore, the contacts 195 are plugs which cover the contacts 170' of the NBP 120, the p-well 115 and the deep n-well 110. By being formed in the trenches 192, the contacts 195 are self-aligned. As shown in FIG. 16, the contacts 170' are isolated from the S/D regions 185 by the insulating spacers 159, including the oxidized material sidewall 157.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
    a back-plane, a p-well and an n-well formed within a bulk substrate;
    a contact extending from each of the back-plane, the p-well and the n-well;
    a gate structure formed above the back-plane, the p-well and the n-well;
    at least one deep trench isolation (DTI) structure extending through the back-plane and the p-well and into the n-well; and
    an insulating spacer isolating the contact of the back-plane from the gate structure and the at least one DTI structure.

2. The structure of claim 1, further comprising an insulating spacer isolating the contact of the p-well from the gate structure.

3. The structure of claim 1, further comprising an insulating spacer isolating the contact of the n-well from the gate structure and a DTI structure in contact with the n-well.

4. The structure of claim 1, wherein the at least one DTI structure surrounds the back-plane, the p-well and the n-well.

5. The structure of claim 1, further comprising a floating contact which extends from the n-well.

6. The structure of claim 1, wherein the insulating spacer comprises an oxidized sidewall and a dielectric material.

7. The structure of claim 6, wherein the dielectric material is a low-k material.

8. The structure of claim 1, further comprising a dielectric material extending across the contacts of the back-plane, the p-well and the n-well.

9. The structure of claim 1, further comprising a plurality of plugs which cover the contacts of the back-plane, the p-well and the n-well.

10. A structure comprising:
    a first well formed within a bulk substrate;
    a first contact extending from the first well;
    a gate structure formed over the first well;
    a back-plane within the bulk substrate;
    at least one deep trench isolation (DTI) structure extending through the back-plane and the first well; and
    a first spacer isolating the first contact from the gate structure and the at least one DTI structure.

11. The structure of claim 10, further comprising:
    a second contact extending from the back-plane; and
    a second spacer isolating the second contact from the gate structure.

12. The structure of claim 11, wherein the second spacer further isolates the second contact from the first contact.

13. The structure of claim 10, wherein the at least one deep trench isolation (DTI) structure surrounds the first well.

14. The structure of claim 10, further comprising a second well formed within the bulk substrate and a floating contact extending from the second well.

15. The structure of claim 10, further comprising at least one plug covering the first contact.

16. The structure of claim 10, wherein the spacer is a low-k material.

17. The structure of claim 16, wherein the spacer further includes an oxidized sidewall.

18. A method comprising:
    forming a back-plane, a p-well and an n-well in a bulk substrate;
    forming contacts extending from each of the back-plane, the p-well and the n-well;
    forming a gate structure above the back-plane, the p-well and the n-well;
    forming at least one deep trench isolation (DTI) structure extending through the back-plane and the p-well and into the n-well; and
    forming an insulating spacer isolating the contact of the back-plane from the gate structure and the at least one DTI structure.

19. The method of claim 18, further comprising forming an insulating spacer isolating the contact of the p-well from the gate structure.

20. The method of claim 18, further comprising forming an insulating spacer isolating the contact of the n-well from the gate structure.

* * * * *